(12) United States Patent  
Volkovich et al.

(10) Patent No.: US 12,393,113 B2  
(45) Date of Patent: Aug. 19, 2025

(54) INTER-STEP FEEDFORWARD PROCESS CONTROL IN THE MANUFACTURE OF SEMICONDUCTOR DEVICES

(71) Applicant: KLA CORPORATION, Milpitas, CA (US)

(72) Inventors: Roie Volkovich, Hadera (IL); Liran Yerushalmi, Zicron Yaacob (IL); Renan Milo, Rishon Lezion (IL); Yoav Grauer, Haifa (IL); David Izraeli, Haifa (IL)

(73) Assignee: KLA CORPORATION, Milpitas, CA (US)

( * ) Notice: Subject to any disclaimer, the term of this patent is extended or adjusted under 35 U.S.C. 154(b) by 210 days.

(21) Appl. No.: 16/770,278

(22) PCT Filed: May 6, 2020

(86) PCT No.: PCT/US2020/031546  
§ 371 (c)(1),  
(2) Date: Jun. 5, 2020

(87) PCT Pub. No.: WO2021/225587  
PCT Pub. Date: Nov. 11, 2021

(65) Prior Publication Data  
US 2022/0026798 A1    Jan. 27, 2022

(51) Int. Cl.  
*G05B 19/4099* (2006.01)  
*G03F 1/70* (2012.01)

(52) U.S. Cl.  
CPC ........... *G03F 1/70* (2013.01); *G05B 19/4099* (2013.01); *G05B 2219/45031* (2013.01)

(58) Field of Classification Search  
None  
See application file for complete search history.

(56) References Cited

U.S. PATENT DOCUMENTS

| | | | |
|---|---|---|---|
| 6,304,999 B1 * | 10/2001 | Toprac | G05B 19/41865 700/121 |
| 6,774,998 B1 * | 8/2004 | Wright | G03F 7/70633 356/399 |
| 6,897,075 B2 * | 5/2005 | Bode | G03F 7/70525 438/7 |
| 7,973,585 B2 * | 7/2011 | Kubo | H03K 19/018528 327/309 |
| 9,093,458 B2 * | 7/2015 | Amir | G03F 7/70633 |
| 9,625,831 B1 * | 4/2017 | Segawa | H01L 21/682 |
| 10,430,719 B2 * | 10/2019 | David | H01L 22/14 |

(Continued)

OTHER PUBLICATIONS

Wipo, Isr for PCT/US2020/031546, Feb. 2, 2021.

*Primary Examiner* — Jason Lin  
(74) *Attorney, Agent, or Firm* — Hodgson Russ LLP

(57) ABSTRACT

A method for process control in the manufacture of semiconductor devices including performing metrology on at least one semiconductor wafer included in a given lot of semiconductor wafers, following processing of the at least one semiconductor wafer by a first processing step, generating, based on the metrology, at least one correctable to a second processing step subsequent to the processing step and adjusting, based on the correctable, performance of the second processing step on at least some semiconductor waters of the given lot of semiconductor wafers.

14 Claims, 4 Drawing Sheets

(56) References Cited

U.S. PATENT DOCUMENTS

| | | | |
|---|---|---|---|
| 10,734,293 B2* | 8/2020 | David | H01L 22/14 |
| 2003/0058428 A1 | 3/2003 | Jun et al. | |
| 2003/0106642 A1 | 6/2003 | Fairbairn et al. | |
| 2005/0136346 A1* | 6/2005 | Ottens | G03F 7/70783 430/30 |
| 2005/0153564 A1* | 7/2005 | Mak | G03F 1/32 430/5 |
| 2006/0250597 A1* | 11/2006 | Nakajima | G03F 9/7049 355/53 |
| 2007/0021860 A1* | 1/2007 | Gertrudus Simons | G03F 9/7011 700/121 |
| 2007/0212856 A1* | 9/2007 | Owen | H01L 22/20 438/478 |
| 2012/0094400 A1 | 4/2012 | Adel et al. | |
| 2013/0107259 A1* | 5/2013 | Choi | G03F 7/70633 257/E23.179 |
| 2014/0356982 A1 | 12/2014 | Barash et al. | |
| 2017/0108783 A1* | 4/2017 | Kramer | G03F 7/706 |
| 2018/0120807 A1* | 5/2018 | Czerkas | G05B 19/402 |
| 2018/0253017 A1* | 9/2018 | Adel | G03F 7/7085 |
| 2019/0279841 A1* | 9/2019 | Xiao | H01J 37/28 |
| 2021/0080837 A1* | 3/2021 | Rijpstra | G03F 7/70525 |

* cited by examiner

INTER-STEP FEEDFORWARD PROCESS CONTROL IN THE MANUFACTURE OF SEMICONDUCTOR DEVICES

FIELD OF THE INVENTION

The present invention relates generally to metrology and more particularly to the measurement of misregistration in the manufacture of semiconductor devices.

BACKGROUND OF THE INVENTION

Various systems and methods for the measurement of misregistration in the manufacture of semiconductor devices are known in the art.

SUMMARY OF THE INVENTION

The present invention seeks to provide novel highly efficient systems and methods for feedforward control between consecutive processing steps involved in the manufacture of semiconductor devices.

There is thus provided in accordance with a preferred embodiment of the present invention a method for process control in the manufacture of semiconductor devices including performing metrology on at least one semiconductor wafer included in a given lot of semiconductor wafers, following processing of the at least one semiconductor wafer by a first processing step, generating, based on the metrology, at least one correctible to a second processing step subsequent to the first processing step and adjusting, based on the correctable, performance of the second processing step on at least some semiconductor wafers of the given lot of semiconductor wafers.

Preferably, the first processing step is different than the second processing step.

Preferably, the method also includes performing additional metrology on at least one semiconductor wafer included in an additional lot of semiconductor wafers processed prior to the given lot, the additional metrology being performed following processing of the at least one semiconductor wafer included in the additional lot of semiconductor wafers by the first processing step.

Additionally or alternatively, the method also includes performing metrology following the performance of the second processing step, the adjusting being based on taking into account differences between the metrology following the first processing step and the metrology following the second processing step.

Preferably, the first and second processing steps are performed within a common layer of the semiconductor wafer.

Additionally or alternatively, the first and second processing steps are respectively performed within different layers of the semiconductor wafer.

Preferably, the at least some wafers for which performance of the second processing step is adjusted includes the at least one semiconductor wafer upon which the metrology is performed.

Preferably, the metrology includes one of imaging-based type metrology and scatterometry-based type metrology.

Preferably, the first and second processing steps include lithography steps.

Preferably, the metrology includes at least one of measurement of misregistration between layers of the at least one semiconductor wafer and measurement of other indices associated with the semiconductor wafer.

There is additionally provided in accordance with another preferred embodiment of the present invention a system for process control in the manufacture of semiconductor devices including a metrology tool operative to perform metrology on at least one semiconductor wafer included in a given lot of semiconductor wafers, following processing of the at least one semiconductor wafer by a first processing step a correctable generator operative to generate, based on the metrology, at least one correctable to a second processing step, subsequent to the first processing step and a controller operative to adjust, based on the at least one correctable, performance of the second processing step on at least some of the semiconductor wafers of the given lot of semiconductor wafers.

Preferably, the first processing step is different than the second processing step.

Preferably, the metrology tool is additionally operative to perform additional metrology on at least one semiconductor included in an additional lot of semiconductor wafers processed prior to the given lot, the metrology tool being operative to perform the additional metrology following processing of the at least one semiconductor wafer included in the additional lot of semiconductor wafers by the first processing step.

Additionally or alternatively, the metrology tool is additionally operative to perform metrology following the performance of the second processing step, the at least one correctable being generated based on taking into account differences between the metrology following the first processing step and the metrology following the second processing step.

Preferably, the first and second processing steps are performed within a common layer of the semiconductor water.

Additionally or alternatively, the first and second processing steps are respectively performed within different layers of the semiconductor wafer.

Preferably, the at least some wafers for which performance of the second processing step is adjusted includes the at least one semiconductor wafer upon which the metrology is performed.

Preferably, the metrology tool includes one of an imaging-based type metrology tool and a scatterometry-based type metrology tool.

Preferably, the first and second processing steps include lithography steps.

Preferably, the metrology includes at least one of measurement of misregistration between layers of the at least one semiconductor wafer and measurement of other indices associated with the semiconductor wafer.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
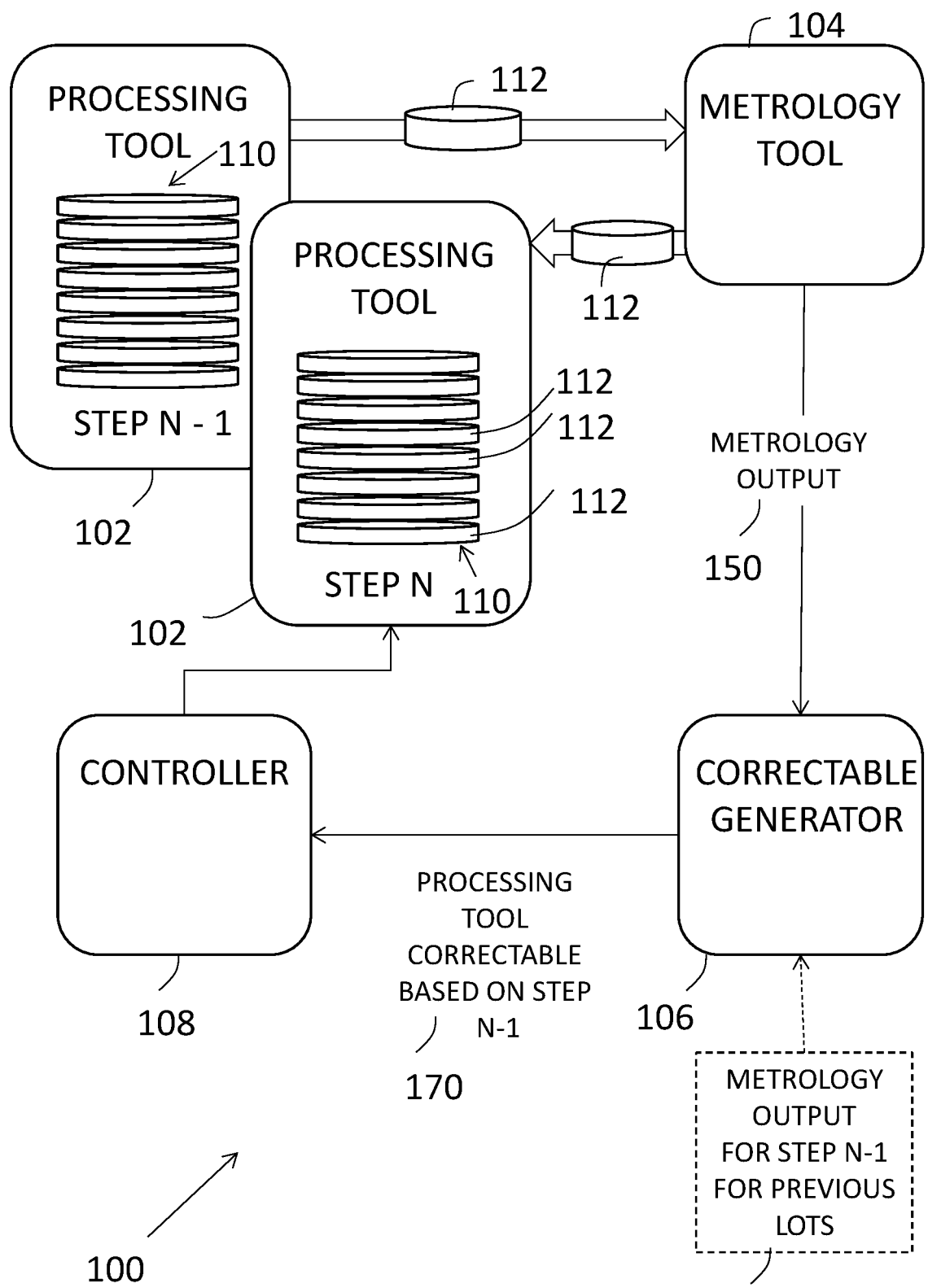
FIG. 1 is a simplified schematic partially pictorial, partially block diagram illustration of operation of a semiconductor wafer processing system including feedforward control, constructed and operative in accordance with a preferred embodiment of the present invention.

Reference is now made to FIG. 1, which is a simplified schematic partially pictorial, partially block diagram illustration of operation of a semiconductor wafer processing system including feedforward control, constructed and operative in accordance with a preferred embodiment of the present invention.

As seen in FIG. 1, there is provided a semiconductor wafer processing system 100 preferably including a semiconductor processing tool 102, a metrology tool 104, a correctable generator 106 for generating correctables based on the output of metrology tool 104 and a controller 108 for controllably adjusting the processing performed by processing tool 102 in accordance with the correctables generated by correctable generator 106.

Processing tool 102 is preferably operative to process at least one lot 110 of semiconductor wafers 112. Lot 110 may be a member of a batch of semiconductor wafers including a number of wafer lots preferably, although not necessarily, of the same type as lot 110, as is described henceforth with reference to FIGS. 2A and 2B. Typically, lot 110 may include 25 semiconductor wafers 112, although fewer wafers 112 are illustrated herein for the purpose of succinctness.

Figure 3:
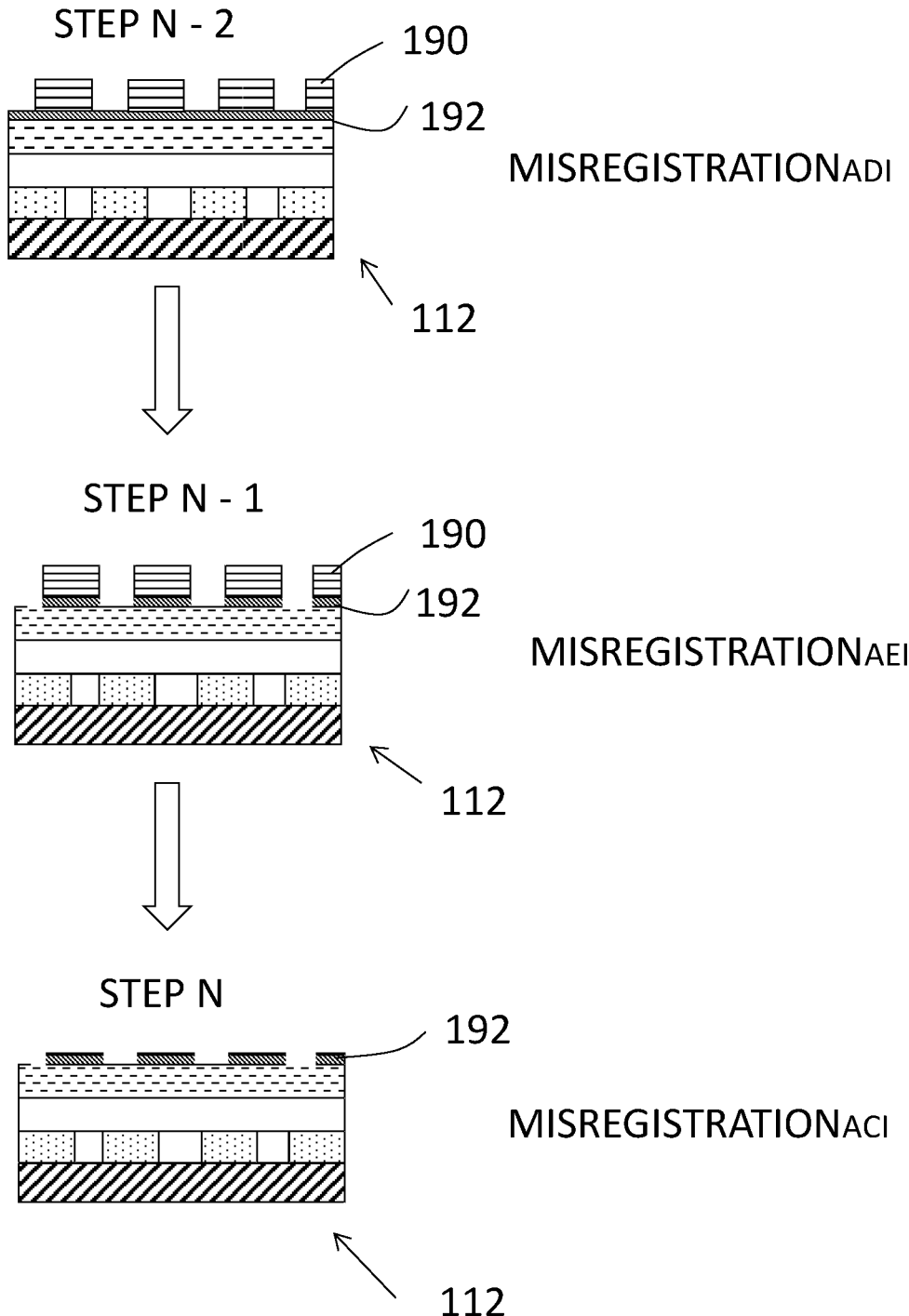
FIG. 3 is a simplified schematic illustration of feedforward control flow in a system of the type shown in FIG. 1.

Processing tool 102 is preferably embodied as a lithographic patterning tool, such as a scanner. An example of a processing tool useful in the system of FIG. 1 is the ASML seamier 1950i, commercially available from ASML of Veldhoven, Netherlands. During processing, lot 110 is preferably retained on a stage of processing tool 102, typically on two chucks thereon. Processing tool 102 is preferably operative to perform a series of processing steps on wafers 112. Here, by way of example, processing tool 102 is shown to perform a first step N–1 followed by a second step N, subsequent to first step N–1 and preferably different therefrom, on wafers 112. It is understood that the steps performed by processing tool 102 may involve a series of steps performed within a single layer of a semiconductor wafer 112, such as development, etching and cleaning steps performed within a single layer. An example of such a series of steps is shown in FIG. 3. Additionally or alternatively, the steps performed by processing tool 102 may involve different steps performed on more than one layer of the semiconductor wafer 112.

Metrology tool 104 is preferably embodied as a misregistration measurement tool, for measuring misregistration between layers of at least some of semiconductor wafers 112. Metrology tool 104 may be an imaging type tool or a scatterometry type tool. An example of a metrology tool useful in the system of FIG. 1 is the Archer ATL100, commercially available from KLA of California, USA. Processing tool 102 and metrology tool 104 are preferably located at a common location such that semiconductor wafers 112 processed by processing tool 102, for example by step N–1, may be readily transferred to metrology tool 104 for the performance of metrology thereon and then returned to processing tool 102 for further processing, for example by step N. It is appreciated that although two units of processing tool 102 are illustrated in FIG. 1, these preferably, although not necessarily, correspond to the same processing tool 102 respectively performing steps N–1 and N on semiconductor wafers 112 of lot 110.

It is a particular feature of a preferred embodiment of the present invention that correctables, derived by correctable generator 106 based on the performance of metrology on at least one semiconductor wafer 112 following the performance of processing step N–1 on the at least one semiconductor wafer 112, are preferably used to adjust the operation of processing tool 102 in the performance of step N o the at least one semiconductor wafer 112 and/or other semiconductor wafers 112 within the lot 110 to which the semiconductor wafer 112 belongs. Correctables derived based on one processing step performed on wafers of a given lot are thus applied to processing tool 102 in order to adjust the performance thereby of another, different and subsequent processing step performed on wafers of the same given lot.

Such feedforward control of processing step N based on the metrology output generated with respect to processing step N–1 is highly advantageous, since it allows a series of processing steps performed on the same lot of semiconductor wafers to be optimized in a serial, feed forward manner, based on the performance of metrology following execution of preceding steps on wafers of the same lot. This is in contrast to conventional process control approaches, in which metrology performed on a given step in a given lot is used as a basis for optimizing the same step in a subsequent lot.

In operation of system 100, knowing the performance of processing step N–1 on semiconductor wafer 112 by processing tool 102, the wafer 112 is preferably physically transferred to metrology tool 104 for the performance of metrology thereon and particularly preferably, for the measurement of misregistration between targets formed on layers of wafer 112. It is appreciated, however, that the metrology performed by metrology tool 104 is not limited to the measurement of misregistration between layers of wafer 112 and may additionally or alternatively include measurement of other parameters or indices associated with wafer 112, such as merit index, contrast, performance parameters such as Tool Induced Shift (TIS) and precision and pupil information, including pupil 3-sigma values and other pupil information merit indices in the case that metrology tool is a scatterometry type tool.

Metrology tool 104 is preferably operative to perform metrology on wafer 112 and to output a metrology output 150. Metrology output 150 is preferably provided to correctable generator 106. Correctable generator 106 is preferably operative to receive and analyze metrology output 150 and to generate one or more correctables to the patterning process performed by processing tool 102 based thereon. Methods for the generation of correctables to the processing of semiconductor wafers based on metrology performed thereon are well known in the art and may be applied within systems and methods of the present invention by one skilled in the art.

Correctable generator 106 is preferably embodied as a hardware or software module, including computer code operative to automatically analyze metrology output 150 and calculate correctables applicable to the process performed by processing tool 102 based thereon. It is appreciated that although correctable generator 106 is illustrated in FIG. 1 as a separate module, outside of both metrology tool 104 and processing tool 102, the functionality of correctable generator 106 may alternatively be included therein. It is further appreciated that correctable generator 106 may be a cloud-based module, in wireless communication at least with metrology tool 104.

Correctable generator 106 is preferably operative to output processing tool correctables 170 and to provide processing tool correctables 170 to controller 108. It is understood that the processing tool correctables generated by correctable generator 106 are based on measurements made on semiconductor wafer 112 following the performance of processing step N−1 thereon. Generated correctables 170 include correctables to settings of processing tool 102, including, by way of example only, correctables to processing tool rotation, magnification, translation and other processing tool settings.

Controller 108 is preferably operative to receive processing tool correctables 170 based on step N−1 and to adjust processing step N performed by processing tool 102 in accordance with processing tool correctables 170 based on step N−1. It is appreciated that such feed forward inter-step control is based on the understanding that the correctables generated based on measurements with respect to an earlier step N−1 are relevant to a later, different step N, due to errors or inaccuracies in structures formed by an earlier step influencing the physical properties of structures formed by a subsequent step and being located thereon.

As seen in FIG. 1, correctable generator 106 may optionally receive an additional metrology output 180. Metrology output 180 may be obtained from the performance of metrology following the execution of STEP N−1 on semiconductor wafers of other lots, previous to lot 110 and possibly included in the same batch as lot 110. Metrology output 180 may be supplied to correctable generator 106 in addition to metrology output 150 and additionally taken into account in the generation of correctables 170.

Figure 2A:
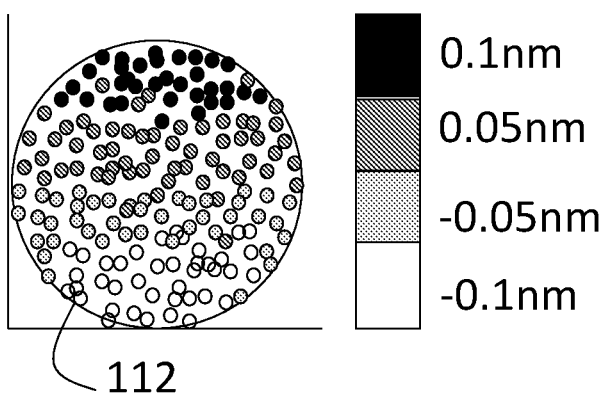
FIGS. 2A and 2B are simplified graphical illustrations of data useful for enhancing feedforward control flow in a system of the type shown in FIG. 1
Figure 2B:
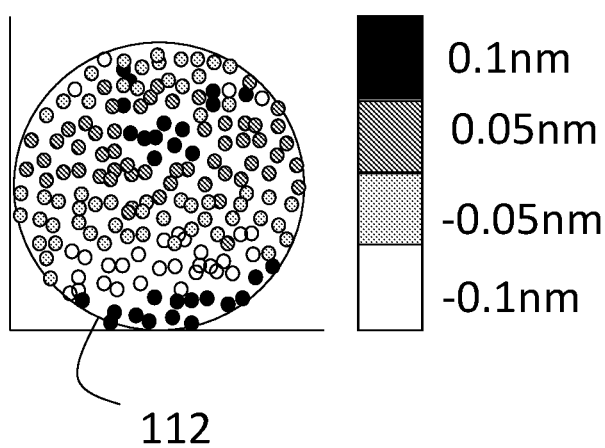

Metrology output 180 for STEP N−1 for previous lots is illustrated in a highly schematic manner in FIGS. 2A and 2B. Turning now to FIGS. 2A and 2B, metrology output 180 (FIG. 1) for a scatterometry-type metrology tool 104 following the performance of STEP N−1 for two lots, LOT 1 and LOT 2 respectively, is shown. It is appreciated that LOT 1 and LOT 2 are both lots previously processed in comparison to current lot 110 (FIG. 1) and preferably belong to the same batch as lot 110. It is understood that the scaled values displayed correspond to measured misregistration values at each of a multiplicity of indicated locations on the surface of wafer 112 of LOT 1 and LOT 2. For the sake of simplicity, these values are displayed along a discrete scale, in increments of 0.05 nm, although it is appreciated that in reality such values would be measured along a continuous scale. As appreciated from consideration of the schematic data in FIGS. 2A and 2B, misregistration output 180 varies between LOT 1 and LOT 2 and may be provided to correctable generator 106. The provision of misregistration output 180 based on previous lots, LOT 1 and LOT 2, in addition to misregistration output 150 based on the current lot 110, may enhance the accuracy of correctables derived by correctable generator 106 and further improve the performance of STEP N by processing tool 102.

In accordance with one preferred embodiment of the present invention, the performance of processing step N on a given wafer is adjusted based on metrology performed on the same wafer following the performance of previous step N−1 thereon. In this embodiment, system 100 preferably operates on a wafer-by-wafer basis, wherein each wafer 112 of lot 110 is preferably transported to metrology tool 104 following the performance of processing step N−1 thereon, has metrology performed thereon, and is then returned to processing tool 102 for processing step N, wherein the performance of step N by processing tool 102 on the same wafer 112 is adjusted based on the metrology output for that wafer. Such wafer-by-wafer operation is particularly relevant to the front end processing of semiconductor wafers, where highly accurate control of wafer parameters at each processing step is critical.

In accordance with an additional or alternative embodiment of the present invention, the performance of processing step N on at least some wafers in a given lot is adjusted based on metrology performed on at least one wafer belonging to the given lot following the performance of step N−1 thereon. In this embodiment, at least one wafer 112 of lot 110 is preferably transported to metrology tool 104 following the performance of processing step N−1 thereon, has metrology performed thereon and is then preferably returned to processing tool 102, wherein the performance of step N by processing tool 102 on additional wafers in lot 110, which additional wafers may or may not include the wafer 112 upon which metrology was performed, is adjusted based on metrology output for wafer 112. In such a mode of operation of system 100, at least one representative wafer 112 per chuck would typically be selected for the performance of metrology thereon.

An example of a feedforward control flow enabled by a system of the type shown in FIG. 1 is illustrated schematically in FIG. 3. As seen in FIG. 3, a first step, here indicated as STEP N−2, may be performed upon semiconductor wafer 112, a cross-section of a portion of which is shown in FIG. 3. By way of example, as illustrated here, STEP N−2 may be a development step at which a layer of photoresist 190 is selectively developed upon a Back Anti-Reflective Coating (BARC) layer 192. Following performance of STEP N−2 on wafer 112, metrology may be performed upon wafer 112 in order to measure misregistration between layers thereof. The metrology output following the performance of STEP N−2 corresponds to the After Development Inspection (ADI) misregistration value and is here indicated, as MISREGISTRATION$_{ADI}$.

Following the measurement of MISREGISTRATION$_{ADI}$, a subsequent step, STEP N−1, may be performed upon wafer 112. By way of example, as illustrated here, subsequent step STEP N−1 may be an etching step at which portions of the BARC layer 192 not coated by photoresist 190 are removed by etching. In accordance with the feedforward approach of the present invention, the performance of etching step STEP N−1 may be adjusted based on correctables to the processing tool 102 (FIG. 1) derived based on the measured value of MISREGISTRATION$_{ADI}$. Following performance of STEP N−1 on wafer 112, metrology may be performed upon wafer 112 in order to again measure misregistration between layers thereof. The metrology output following the performance of STEP N−1 corresponds to the After Etching Inspection (AEI) misregistration value and is here indicated as MISREGISTRATION$_{AEI}$.

Following the measurement of MISREGISTRATION$_{AEI}$, a subsequent step, STEP N, may be performed upon wafer 112. By way of example, as illustrated here, subsequent step STEP N may be a cleaning step at which the photoresist 190 is cleaned off wafer 112. In accordance with the feedforward approach of the present invention, the performance of cleaning step STEP N may be adjusted based on correctables to the processing tool 102 derived based on the measured value of MISREGISTRATION$_{AEI}$. Following performance of STEP N on wafer 112, metrology may be performed upon wafer 112 in order to again measure misregistration between layers thereof. The metrology output following the performance of STEP N corresponds is to the After Cleaning Inspection (ACI) misregistration value and here indicated as MISREGISTRATION$_{ACI}$.

It is appreciated based on the forgoing that the feedforward process control of the present invention may be applied in serial manner between a set of consecutive steps involved in the manufacture of semiconductor wafer 112. It is further appreciated that although the series of steps illustrated in FIG. 3 are shown as processing steps involved in the ultimate formation of single layer of wafer 112, the feedforward control approach of the present invention may also be applied between different processing steps involved the formation of more than one layer of wafer 112.

In accordance with the feedforward process control of the present invention described so far, the metrology output of a given step performed on a given wafer is used as a basis for deriving correctables applied to a subsequent, different step, performed on the given wafer or on other wafers belonging to the same lot as the given wafer. However, in certain embodiments of the present invention, metrology may additionally be performed on the given wafer following the performance of the subsequent step on the given wafer and the metrology output obtained following the performance of the subsequent step be used to further adjust the correctables to the subsequent step as performed on other wafers belonging to the same lot as the given wafer. In terms of the example shown in FIG. 3, STEP N may initially be adjusted in accordance with correctables derived based on MISREGISTRATION$_{AEI}$ derived based on STEP N−1 as described above. STEP N as adjusted may then be performed on a given wafer 112 and MISREGISTRATION$_{ACI}$ measured for the given wafer. The performance of STEP N on other wafers included in the lot to which given wafer 112 belongs may then be optimized based both on MISREGISTRATION$_{AEI}$ derived based on STEP N−1 and MISREGISTRATION$_{ACI}$ measured for the given wafer based on STEP N. By way of example, the performance of STEP N may be optimized based on a difference between the metrology measurement based on STEP N and the metrology measurement based on STEP N−1.

In accordance with another possible embodiment of the present invention, in addition or alternatively to adjusting a subsequent processing step in accordance with correctables derived based on metrology performed on a previous, different processing step for the same wafer or for wafers of the same lot as the wafer upon which the metrology was performed, a progression of changes in metrology outputs between steps may be found. Thus, in the example of FIG. 3, a first change in misregistration may be defined as $\Delta MIS_1$=MISREGISTRATION$_{AEI}$−MISREGISTRATION$_{ADI}$ and a second change in misregistration may be defined as $\Delta MIS_2$=MISREGISTRATION$_{ACI}$−MISREGISTRATION$_{AEI}$. Trends or changes in misregistration values between steps may be representative of process variation and may be used to predict a value of $\Delta MIS_N$, representative of the Nth change in misregistration, and processing by processing tool adjusted accordingly for wafer 112 itself and/or for other wafers within the same lot as that of wafer 112.

It is appreciated that the feedforward approach of the present invention is highly advantageous in terms of time and throughput, since it allows processing of wafers in a given lot to be corrected within the lot and/or within the wafer itself. This is in contrast to conventional approaches, in which correctables derived based on a given step in a given lot are applied to the performance of the same given step in subsequent lots, thus wasting both time and wafers in order to collect sufficient data to correct subsequent lots.

The optimization of control of the Nth processing step on a given wafer belonging to a given lot of wafers by feedforward control in accordance with metrology based on the N−1th processing step for the given wafer or lots of wafers, in accordance with preferred embodiments of the present invention, may be generally expressed as follows:

$$\text{Control MIS}_{lot\ N}^{STEP\ N}=f(\text{MIS}_{lot\ N}^{STEP\ N-1};\Delta(\text{MIS}_{lot\ N}^{STEP\ N};\text{MIS}_{lot\ N-1}^{STEP\ N-1})) \quad (1)$$

wherein Control MIS$_{lot\ N}^{STEP\ N}$, referring to the control of misregistration of processing step N of at least one wafer of lot N, is expressed as a function of the misregistration measured for processing step N−1 for lot N and the difference between the misregistration measured for processing step N for lot N and processing step N−1 for lot N−1. It is appreciated that equation (1) is expressed in general terms and includes various possible embodiments of the invention, not all of which are necessarily implemented. By way of example, in the case that additional metrology input 180 (FIG. 1) from previous lots is not provided, the term MIS$_{lot\ N-1}^{STEP\ N-1}$ is not relevant and equation 1 may be adjusted accordingly. Further by way of example, in the case that metrology is not performed based on step N, the term MIS$_{lot\ N}^{STEP\ N}$ is not relevant and equation 1 may be adjusted accordingly.

Figure 4:
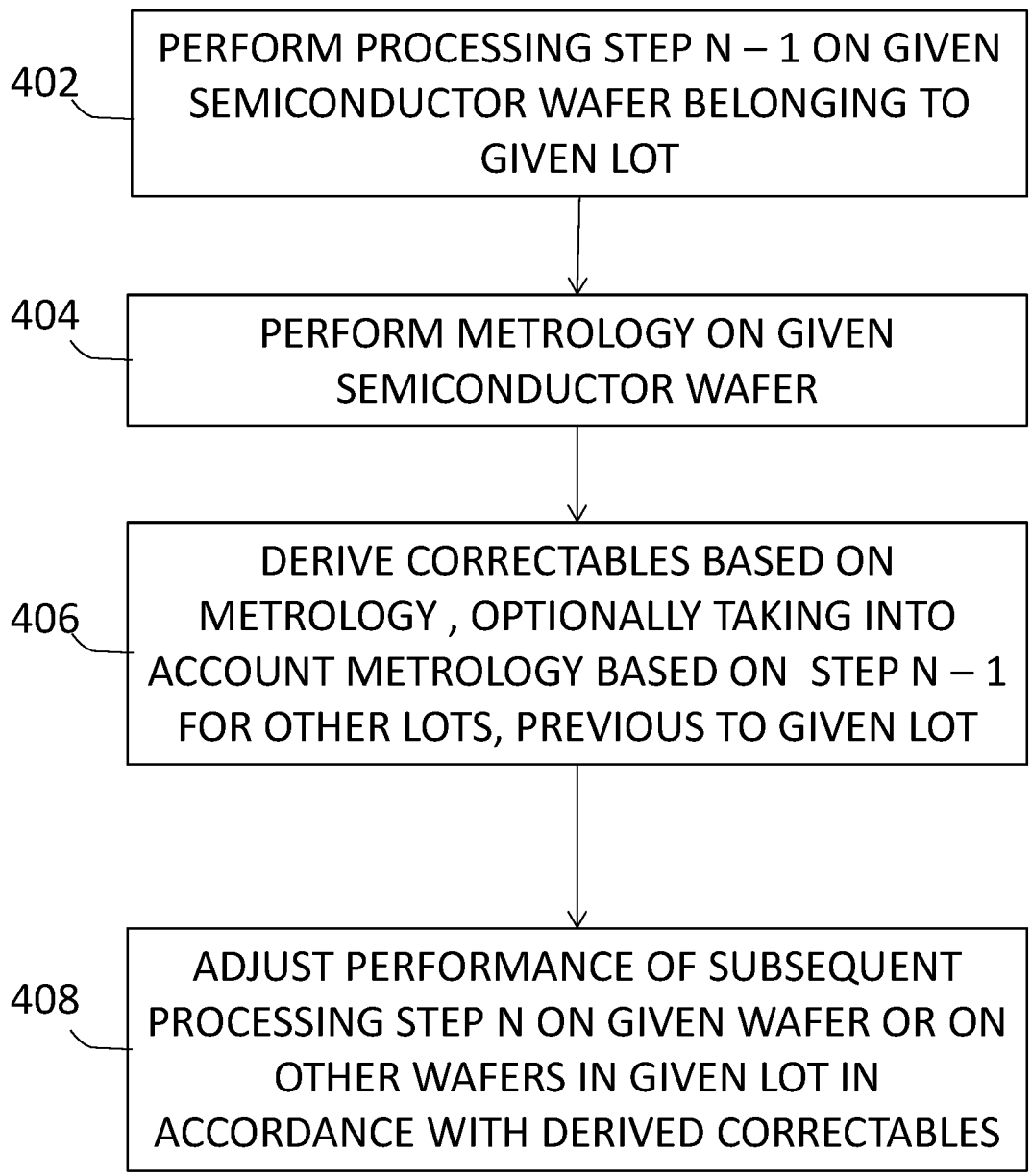
FIG. 4 is a simplified flow chart illustrating steps involved in feedforward process control in semiconductor wafer processing, in accordance with a preferred embodiment of the present invention.

Reference is now made to FIG. 4, which is a simplified flow chart illustrating steps involved in feedforward process control in semiconductor wafer processing, in accordance with a preferred embodiment of the present invention.

As seen in FIG. 4, a method 400 for inter-step feedforward control in semiconductor processing may begin at a first step 402 whereas processing step N−1 is performed on a given wafer belonging to a given lot. As seen at a second step 404, metrology may then be performed on the given wafer. The metrology may involve measurement of misregistration between layers of the given wafer and/or measurement of other indices associated with the given wafer such as sensitivity, reflectivity, pupil indices such as pupil 3-sigmas, performance parameters such as TIS and precision and overlay landscape information at resonance locations.

As seen at a third step 406, correctables may then be derived based on the metrology performed at second step 404. The correctables derived are preferably correctables to the processing performed on the given wafer. The correctables derived may include, by way of example, correctables to settings of a processing tool processing the given wafer, such as processing tool rotation, magnification and translation. The correctables may be derived based on optionally additionally taking into account metrology performed based on step N−1 on wafers in other lots, processed prior to the processing of the given lot to which the given wafer belongs.

As seen at a fourth step 408, the performance of a subsequent processing step N on the given wafer or on other wafers in the given lot may then be adjusted in accordance with the correctables derived at third step 406.

It is appreciated that method 400 is not limited to first-fourth steps 402-408 described hereinabove. Rather, method 400 may include additional steps, possibly performed between ones of steps 402-408, and/or may include alternative steps to the ones described hereinabove.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A method for process control in the manufacture of semiconductor devices comprising:
performing metrology on at least one semiconductor wafer included in a given lot of semiconductor wafers, following processing of said at least one semiconductor wafer by a first processing step, wherein said first processing step is a photoresist development step in which a layer of photoresist is selectively developed on said at least one semiconductor wafer, wherein said metrology comprises measurement of misregistration between said layer of photoresist and another layer of said at least one semiconductor wafer and measurement of other indices associated with said semiconductor wafer, wherein said other indices include reflectivity and pupil indices, and wherein said metrology comprises scatterometry-based type metrology;
performing additional metrology on at least one semiconductor wafer included in an additional lot of semiconductor wafers processed prior to said given lot, said additional metrology being performed following processing of said at least one semiconductor wafer included in said additional lot of semiconductor wafers by said first processing step, wherein said additional metrology comprises measurement of a second misregistration;
generating, based on said metrology on at least one semiconductor wafer included in said given lot and said additional metrology on at least one semiconductor wafer included in said additional lot of semiconductor wafers processed prior to said given lot, at least one correctable to a second processing step subsequent to said first processing step;
adjusting, based on said correctable, performance of said second processing step on at least some other semiconductor wafers of said given lot of semiconductor wafers, wherein said first processing step is different than said second processing step, and wherein said second processing step is an etching step or a cleaning step;
performing metrology following said performance of said second processing step, said adjusting being based on taking into account differences between said metrology following said first processing step and said second processing step, wherein said metrology following said performance of said second processing step comprises measurement of a third misregistration; and
updating said correctable based on said misregistration of said semiconductor wafer and a difference between said second misregistration and said third misregistration.

2. The method according to claim 1, wherein said first and second processing steps are performed within a common layer of said semiconductor wafer.

3. The method according to claim 1, wherein said first and second processing steps are respectively performed within different layers of said semiconductor wafer.

4. The method according to claim 1, wherein said at least some wafers for which performance of said second processing step is adjusted further comprises said at least one semiconductor wafer upon which said metrology is performed.

5. The method according to claim 1, wherein said other indices further include tool induced shift.

6. The method according to claim 5, wherein said other indices further include precision and overlay landscape information at resonance locations.

7. The method according to claim 1, wherein said other indices further include precision and overlay landscape information at resonance locations.

8. A system for process control in the manufacture of semiconductor devices comprising:
a metrology tool operative to perform metrology on at least one semiconductor wafer included in a given lot of semiconductor wafers, following processing of said at least one semiconductor wafer by a first processing step, wherein said first processing step is a photoresist development step in which a layer of photoresist is selectively developed on said at least one semiconductor wafer, wherein said metrology comprises measurement of misregistration between said layer of photoresist and another layer of said at least one semiconductor wafer and measurement of other indices associated with said semiconductor wafer, wherein said other indices include reflectivity and pupil indices, and wherein said metrology tool comprises a scatterometry-based type metrology tool;
wherein said metrology tool is additionally operative to perform additional metrology on at least one semiconductor wafer included in an additional lot of semiconductor wafers processed prior to said given lot, said metrology tool being operative to perform said additional metrology following processing of said at least one semiconductor wafer included in said additional lot of semiconductor wafers by said first processing step wherein said additional metrology comprises measurement of a second misregistration;
a correctable generator operative to generate, based on said metrology on at least one semiconductor wafer in said given lot and said additional metrology on at least one semiconductor wafer included in said additional lot of semiconductor wafers processed prior to said given lot, at least one correctable to a second processing step, subsequent to said first processing step;
a controller operative to adjust, based on said at least one correctable, performance of said second processing step on at least some other semiconductor wafers of said given lot of semiconductor wafers, wherein said first processing step is different than said second processing step, and wherein said second processing step is an etching step or a cleaning step; and
wherein said metrology tool is additionally operative to perform metrology following said performance of said second processing step, wherein said metrology following said performance of said second processing step comprises measurement of a third misregistration, and wherein said correctable generated using said correctable generator is updated based on said misregistration of the semiconductor wafer and a difference between said second misregistration and the third misregistration.

9. The system according to claim 8, wherein said first and second processing steps are performed within a common layer of said semiconductor wafer.

10. The system according to claim 8, wherein said first and second processing steps are respectively performed within different layers of said semiconductor wafer.

11. The system according to claim 8, wherein said at least some wafers for which performance of said second processing step is adjusted further comprises said at least one semiconductor wafer upon which said metrology is performed.

12. The system according to claim 8, wherein said other indices further include tool induced shift.

13. The system according to claim 12, wherein said other indices further include precision and overlay landscape information at resonance locations.

14. The system according to claim 8, wherein said other indices further include precision and overlay landscape information at resonance locations.

\* \* \* \* \*